United States Patent [19]
Charvat et al.

[11] Patent Number: 5,202,291
[45] Date of Patent: Apr. 13, 1993

[54] HIGH $CF_4$ FLOW-REACTIVE ION ETCH FOR ALUMINUM PATTERNING

[75] Inventors: Peter K. Charvat, Portland; Chris Kardas, Tigard, both of Oreg.

[73] Assignee: Intel Corporation, Santa Clara, Calif.

[21] Appl. No.: 883,067

[22] Filed: May 8, 1992

Related U.S. Application Data

[63] Continuation of Ser. No. 588,462, Sep. 26, 1990, abandoned.

[51] Int. Cl.[5] .......................................... H01L 21/465
[52] U.S. Cl. .................................... 437/245; 156/643; 156/646; 148/DIG. 131
[58] Field of Search ................. 156/643, 646; 437/245; 198/DIG. 131

[56] References Cited

U.S. PATENT DOCUMENTS

| | | | |
|---|---|---|---|
| 4,267,013 | 5/1981 | Iida et al. | 156/643 |
| 4,372,807 | 2/1983 | Vossen, Jr. et al. | 156/646 |
| 4,380,488 | 4/1983 | Reichelderfer et al. | 156/643 |
| 4,412,885 | 11/1983 | Wang et al. | 156/643 |
| 4,618,398 | 10/1986 | Nawata et al. | 156/643 |
| 4,713,141 | 12/1987 | Tsang | 156/646 |
| 4,838,992 | 6/1989 | Abraham | 156/643 |
| 5,106,471 | 4/1992 | Galvin et al. | 156/643 |

OTHER PUBLICATIONS

Hortwitz; "Reactive sputter etching . . . based on $CF_4$ and $Cl_2$" J. Vac. Sci. Technol., 19(4), Nov./Dec. 1981, pp. 1408-1411.
*Proceedings of the Fifth Symposium on Plasma Processing,* vol. 85-1, The Electromechanical Society, Inc., 1985.

*Primary Examiner*—Brian E. Hearn
*Assistant Examiner*—Trung Dang
*Attorney, Agent, or Firm*—Blakely Sokoloff Taylor & Zafman

[57] ABSTRACT

An anisotropic reactive ion etching of an aluminum metal film of a semiconductor device. The device is placed in a reactive ion etcher using a $CF_4$, $Cl_2$ and $BCl_3$ gas mixture to anisotropically etch the aluminum metal film layer wherein the gas mixture has a ratio of $CF_4:Cl_2$ such that the aluminum etch rate increases as the amount of $CF_4$ relative to $Cl_2$ increases.

16 Claims, 3 Drawing Sheets

Aluminum Etch Rate v. CF$_4$:Cl$_2$ Concentration Ratio

HIGH CF₄ FLOW-REACTIVE ION ETCH FOR ALUMINUM PATTERNING

This is a continuation of application Ser. No. 07/588,462, filed Sep. 26, 1990, abandoned.

BACKGROUND OF THE INVENTION

1. Field of the Invention

This invention relates to the field of dry etching of aluminum and more specifically to the reactive ion etching of an aluminum layer in the fabrication of a semiconductor device.

2. Prior Art

Aluminum or aluminum alloyed with small amounts of silicon or copper, or both, are most commonly used in the interconnection metallurgy of integrated circuits. As modern semiconductor devices decrease in size to meet the requirements of high speed, high packing densities, the widths of the metallic interconnect lines as well as the spaces between them must decrease. Because of current carrying requirements, the thickness of the interconnect lines cannot be reduced. In the fabrication of modern semiconductor devices it is more important than ever to be able to anisotropically etch aluminum and aluminum alloys.

Wet chemical etching processes for aluminum films are not viable processes for modern semiconductor devices because the isotropic nature of wet etching results in a large loss of cross-sectional area. Wet etching processes are generally inadequate for defining features less than 3 $\mu$m. Sputter etching with an inert gas is a directional process, but because the selectivity between the material to be etched and the underlying material is usually poor, this technique has found only limited applications. Reactive ion etching processes have been thought to best meet the requirements of VLSI technology. These processes are often directional and can have good selectivity. Reactive ion etching of aluminum and aluminum alloys in gas mixtures containing a chlorinated reactant have been used successfully to form interconnect wirings for VLSI circuits.

Various reactive ion etching techniques for aluminum are taught in an article by Geraldine C. Schwartz entitled "Reactive Plasma Assisted Etching of Aluminum and Aluminum Alloys", recorded in the proceedings of the fifth symposium on plasma processing. One such method utilizes $CF_4$, $BCl_3$ and $Cl_2$ as the gases for the reactive ion etch. The gases are present at a ratio of $Cl_2:CF_4 \geq 1:1$ and $BCl_3:Cl_2 \geq 2:1$. Chlorine is the species that reacts with and removes the aluminum. The carbon containing gas ($CF_4$) coats the aluminum side walls as they are exposed and protects them from the reactive species. The role of $BCl_3$ has historically been debated. It has been thought that because $Cl_2$ reacts and $CF_4$ protects, if the ratio of $CF_4:Cl_2$ is increased to greater than unity then the etch rate of the aluminum would decrease and eventually go to zero.

The major disadvantage with etching aluminum by the described prior art method is the photoresist undercutting and the lack of anisotropic etching. The prior art method yields an etch bias of between 0.25–0.3 $\mu$m. That is, the measured photoresist line width is 0.25–0.3 $\mu$m larger than the resulting aluminum line width. This is a very large difference and one which is inadequate in the manufacturing of modern devices where the conducting lines can be less than a micron and separated by only about 0.8 $\mu$m. In these cases, the resulting lines are at least 30% narrower than desired, presenting performance and reliability problems for the created integrated circuits. Such narrow lines increase the potential for electromigration in the integrated circuit. Such narrow lines also cause poor metal overlap of contacts, and poor surround of vias. The alignment tolerance of later process steps can also be reduced because of the poor metalization. Another disadvantage with the prior art method is the inability to accurately and consistently determine the end point of the aluminum etch.

It is appreciated that what is needed is a method to anisotropically etch an aluminum metal layer in a conventional reactive ion etcher without undercutting a photoresist mask and to provide a close process control over the etching cycle.

SUMMARY OF THE INVENTION

The present invention provides for a novel method to anisotropically reactive ion etch aluminum and aluminum alloys. The plasma is comprised of a chlorinated and a carbon containing gas mixture wherein the chlorinated gas provides the etching and the carbon containing gas reacts to provide an inhibiting layer along the side wall of the aluminum layer under the photoresist such that an anisotropic etching of the aluminum results. The present invention utilizes a gas mixture wherein the ratio of carbon atoms to chlorine molecules is such that the etch rate of aluminum increases as the amount of carbon atoms increases.

DESCRIPTION OF THE PREFERRED EMBODIMENT(S)

The present invention describes a method for anisotropically reactive ion etching a layer of aluminum. In the following description numerous specific details are set forth such as flow rates, pressure settings, etc., in order to provide a more thorough understanding of the present invention. It will be obvious, however, to one skilled in the art that the present invention may be practiced without these details. In other instances, well-known processes have not been described in detail in order to not unnecessarily obscure the present invention.

Figure 1:
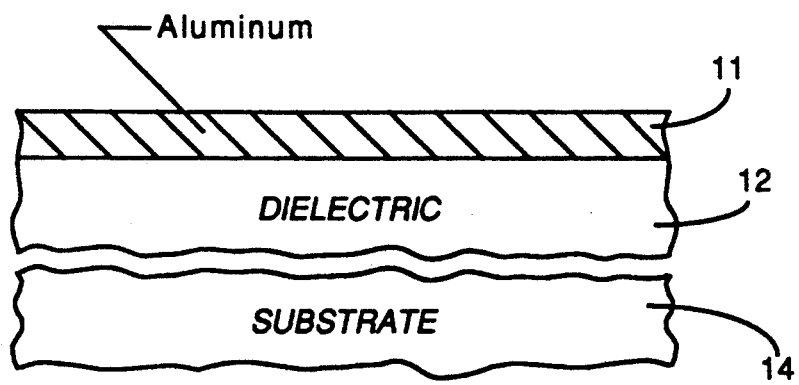
FIG. 1 is a cross-sectional view illustrating the formation of an aluminum layer over an underlying dielectric layer.
Figure 2:
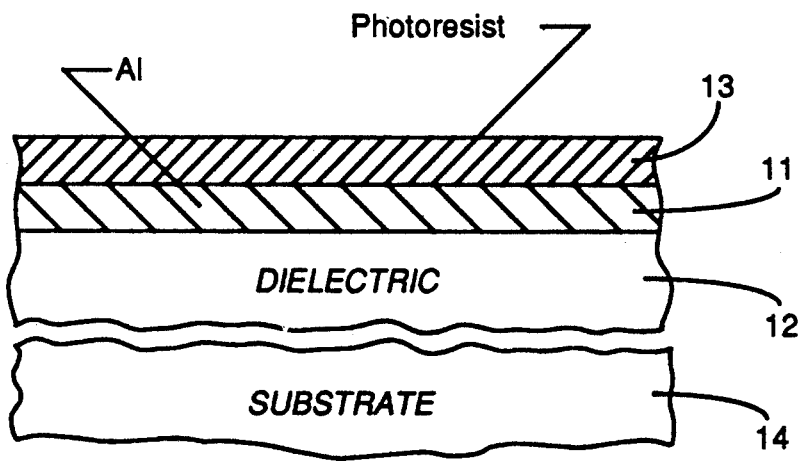
FIG. 2 is a cross-sectional view showing a formation of a photoresist layer over the aluminum layer.

Referring to FIG. 1, a layer of aluminum 11 is deposited over underlying dielectric layer 12. The underlying dielectric layer 12 may be comprised of most any dielectric, such as an oxide; however, the underlying layer need not necessarily be of a dielectric material. The aluminum layer 11 may also be deposited over another metal layer. Most any prior art deposition technique may be utilized to deposit the aluminum layer 11. The preferred embodiment deposits a film of aluminum by sputtering from an aluminum target. Next, as shown in FIG. 2, a positive photoresist layer 13 is formed above the aluminum layer 11. Such deposition of a photoresist layer 13 on an aluminum layer 11 is well-known in the prior art, as is the subsequent patterning of the photoresist layer 12 which is shown in FIG. 3.

Figure 3:
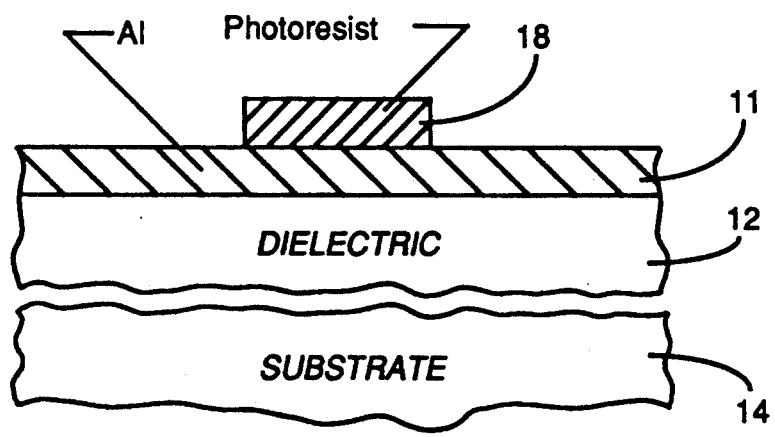
FIG. 3 is a cross-sectional view illustrating a patterning of the photoresist layer.

Referring to FIG. 3, the photoresist layer is masked, exposed and developed such that the photoresist layer remains only over a portion of the aluminum layer 11. The photoresist layer 18 functions as a mask during the etching of the aluminum layer 11.

Figure 4:
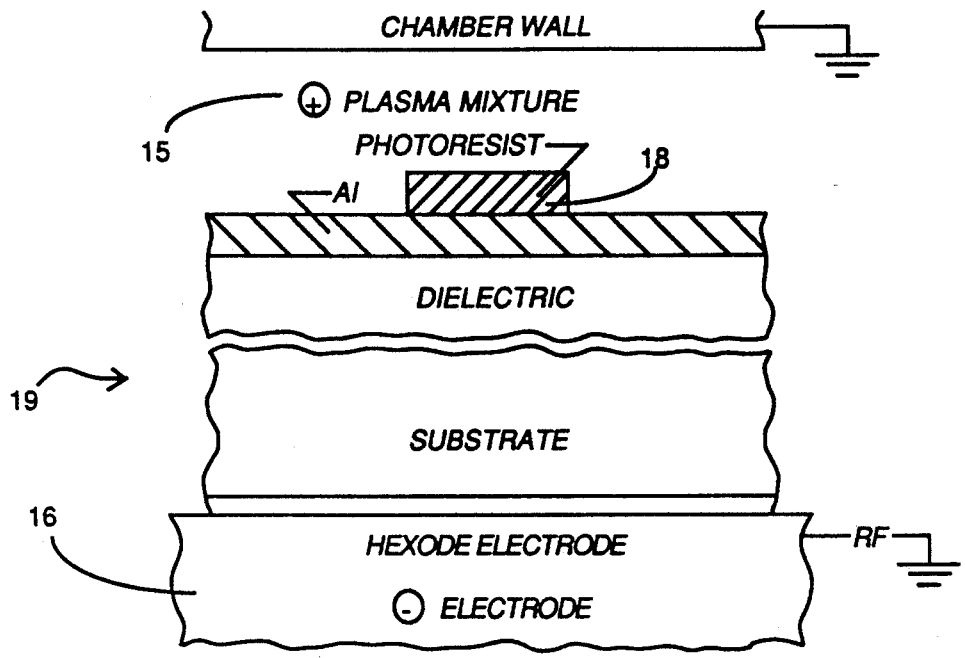
FIG. 4 is a cross-sectional view illustrating the placement of the semiconductor device on an electrode that is negatively charged due to the self-bias DC electrical potential developed by the presence of a plasma.

Referring to FIG. 4, the semiconductor device 19 is introduced into a hexode reactor such as the Applied Materials AME-8330 with optical end point detection. A hexode reactor is comprised of an inner hexagonal shaped electrode 16 on which semiconductor devices are mounted and an outer chamber wall which serves as a second electrode. A plasma 15 is developed in the reaction chamber by subjecting the inner hexode electrode to an applied electrical power at a frequency of 13.56 megahertz while the outer electrode (chamber wall) is grounded. A self-biased direct current electrical potential is developed between the postitively biased plasma 15 and the negatively biased hexode electrode 16. The powered hexode electrode 16 is about half as large as the grounded chamber wall causing ion bombardment of the powered electrode while minimizing the ion bombardment of the grounded electrode. Although the preferred embodiment utilizes a hexode reactor to increase throughput by processing up to eighteen wafers at one time, most any prior art reactive ion etcher may be utilized.

The plasma 15 formed in the reaction chamber of the etcher is comprised of a mixture of chlorinated gas and carbon containing gas. The preferred embodiment utilizes a mixture of $CF_4$, $Cl_2$ and $BCl_3$ gases wherein the concentration of the reactive $Cl_2$ molecules is only about 20%. The total flow rate of the $CF_4$, $Cl_2$ and $BCl_3$ mixture is at about 200-300 sccm and the pressure ranges from 20-50 millitorr. The RF power supplied to the hexode electrode is continuously adjusted so that a given self-bias, typically between 200-300 volts, is maintained. Helium may be added to the gas mixture if it is found that a large RF power is required in order to maintain the desired self-bias voltage.

Figure 5:
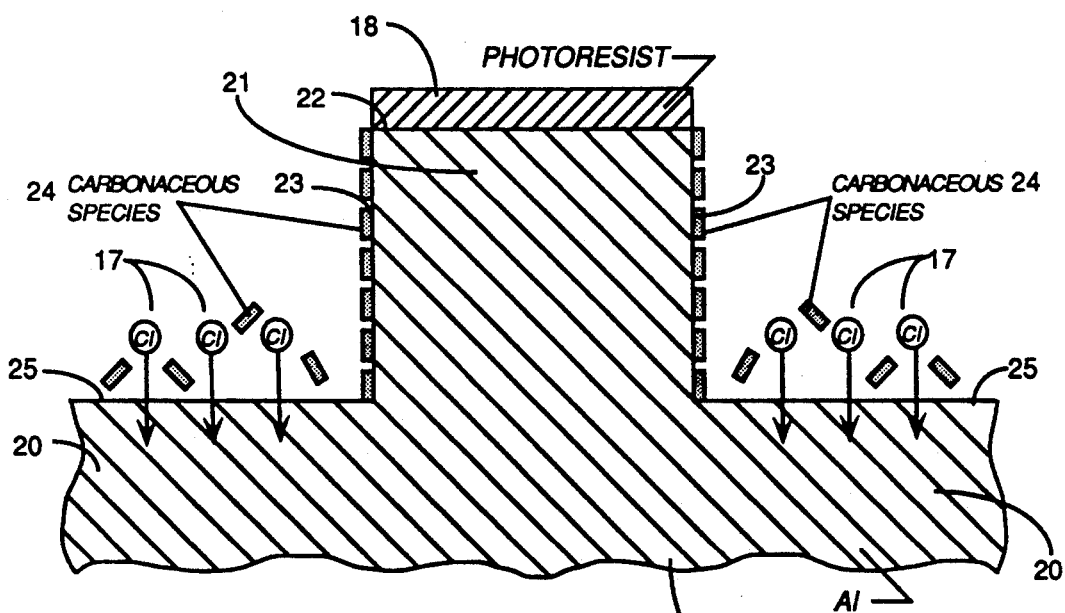
FIG. 5 is an expanded view illustrating the aluminum layer and the reaction of chlorinated and carbon containing gases on the aluminum layer.

Referring to FIG. 5, an expanded drawing illustrates the anisotropic properties of the present etching technique. Chlorine atoms 17 are formed from the $Cl_2$ molecules and absorbed on the surface of the exposed portion 20 of the aluminum layer 11. The desorption of chlorine atoms into the exposed portion 20 causes the etching of the exposed portion 20. The exposed aluminum surface readily reacts with Cl atoms and $Cl_2$ molecules to form $AlCl_3$ and $Al_2Cl_6$. Portion 21, however, under the photoresist layer 18 does not etch because the chlorine atoms 17 cannot penetrate into portion 21. The photoresist 18 prevents the penetration of chlorine atoms along the top surface 22 of portion 21. The aluminum side walls 23 are covered by a carbonaceous film 24 as they are formed and are protected from being reacted by the chlorine atoms 17.

The exact composition of the carbonaceous film is unknown, but it is thought to contain fluorocarbon polymers such as $CF_3$ originating from the $CF_4$ and elements present on the semiconductor device such as photoresist. The carbonaceous film 24 operates as an inhibiting layer which passivates the side wall 23. The inhibiting layer of carbonaceous film 24 forms only along the side wall 23 and not along surface 25. This is because the ion bombardment component of the reactive ion etch destroys the carbonaceous film as it forms along surface 25. The ion bombardment destroys the film layer along surface 25 and not the film layer along the side wall 23 because energetic particles generally arrive at an angle perpendicular to the wafer surface and hence the side walls experience little or no ion bombardment. With the carbonaceous film removed from surface 25 a chemical reaction between Cl atoms and aluminum can take place. The etching of the aluminum is carried out mainly by the chemical reaction component of the reactive ion etch and to a much lesser degree by ion bombardment. In essence, the chlorine atoms 17 etch away aluminum 11 along surface 25 without attacking the side wall 23.

The method of the present invention, like the prior art method, utilizes a gas mixture comprised of $CF_4$, $Cl_2$ and $BCl_3$. The present invention, however, utilizes the gases in a ration never before explored. The present invention utilizes $CF_4$ and $Cl_2$ gases at a concentration ratio of $CF_4:Cl_2 \geq 2$. The prior art method uses a gas mixture where the concentration ratio is $CF_4:Cl_2 \leq 1$.

Figure 7:
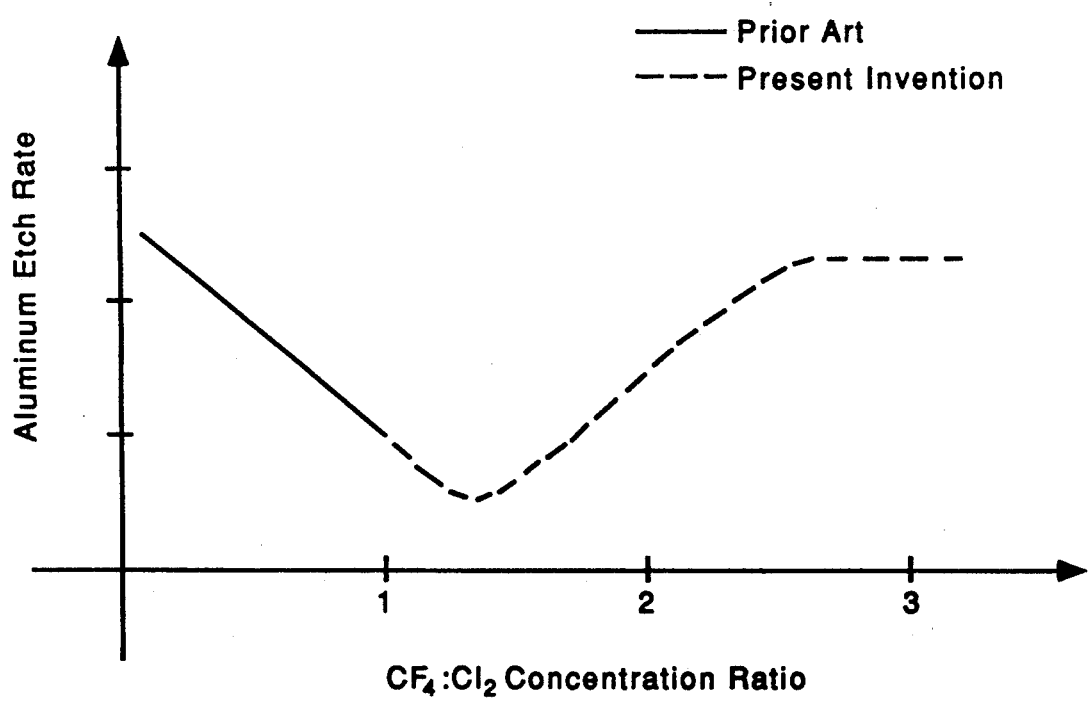
FIG. 7 is a plot of aluminum etch rate v. $CF_4: Cl_2$ concentration ratio.

Referring to FIG. 7, a graph which represents the etch rate of aluminum verses the $CF_4:Cl_2$ concentration ratio is shown. The portion of the graph depicting the prior art mixing ratio is shown as a continuous line in FIG. 7. It is readily apparent from FIG. 7 that at the prior art gas mixing ratio as the concentration of $CF_4$ increases relative to $Cl_2$, the etch rate of aluminum decreases. That is, the plot of the aluminum etch rate is negative sloping at the prior art concentration ratio It had been previously thought that the etch rate of aluminum would continue to drop in this manner until it reached zero. It was discovered by applicant, however, that by further increasing the $CF_4$ concentration in the plasma, the aluminum etch rate actually did not approach zero but instead reached a minimum and then began to increase. It is to be appreciated that the plot of the aluminum etch rate is positive sloping at the present invention's ratio of $CF_4:Cl_2$. The graph of aluminum etch rate versus the novel of $CF_4:Cl_2$ mixing ratio is shown as a broken line in FIG. 7. It is not completely understood why the etch rate increases as the concentration of $CF_4$ relative to $Cl_2$ increases.

More importantly, however, applicant has found that by reactive ion etching aluminum or aluminum alloys in a plasma containing $CF_4$ and $Cl_2$ mixed at the novel concentration ratio, an excellent etch bias is observed. An etch bias of between 0.03-0.08 $\mu$m is easily and consistently obtained with the present invention. Such an etch bias results in an aluminum patterning which is almost an exact replica of the patterning formed in photoresist. This is an extremely advantageous feature for the manufacturing of modern semiconductor devices where aluminum lines have widths of less than a micron. The prior art concentration ratio results in an etch bias of between 0.25-0.3 $\mu$m which is quite unsatisfactory for the manufacturing of modern semiconductor devices. As mentioned earlier, such a poor etch bias creates performance and reliability problems.

Another advantageous result from etching with $Cl_2$ and $CF_4$ at the novel concentration ratio is that a smaller amount of $BCl_3$ is required in the process. The prior art etching technique utilizes a gas mixture which contains at least twice as much $BCl_3$ as $Cl_2$. The present invention, on the other hand, requires only as much $BCl_3$ as $CF_4$. That is, about 30% less $BCl_3$ is required in the present invention than is required in the prior art method. Because $BCl_3$ is an extremely toxic and expensive gas, it is worthwhile to use it sparingly. $BCl_3$ is also a highly reactive gas and forms residues upon contact with oxygen or water. Such residues have been known to form in and clog pump exhaust lines of reactive ion etchers creating constant maintenance problems. Although the exact role of $BCl_3$ is debated, it is known that without $BCl_3$ the definition of the resulting aluminum lines is poor. In order to obtain good etching results, therefore, $BCl_3$ should be used in the gas mixture.

The aluminum etching process is continued until the underlying layer 12 is completely revealed. The completion of the aluminum etch is signalled with optical end point detection by observing the intensity of radiation emitted at 370 nanometers. This radiation level depicts the presence of aluminum chloride $AlCl_3$ in the reaction chamber. Aluminum chloride is a by-product of the aluminum etch and is present only white there is aluminum being etched. By utilizing the present invention's mixture of gases, a perfect square wave, representing the intensity of emission at 370 nanometers against time, is formed. That is, before the etch is started there is no emission at 370 nanometers; then, during the etch a consistent intensity of radiation at 370 nanometers is observed; and after the etch is complete, when there is no more aluminum present, the radiation intensity falls off to zero. With the prior art gas mixture, optical end point detection is extremely difficult to determine because of oscillations in the intensity of radiation at 370 nanometers. A clear end point detection is important so that a slight over etch may be utilized to assure that all of the aluminum is removed to prevent electrical shorts between aluminum features. Without the ability to consistently and accurately end point detect, too much over etching or under etching can occur. Too much over etching can destroy the fabricated aluminum lines and the underlying material of the device. Under etching can leave aluminum which can cause undesired electrical shorts.

Figure 6:
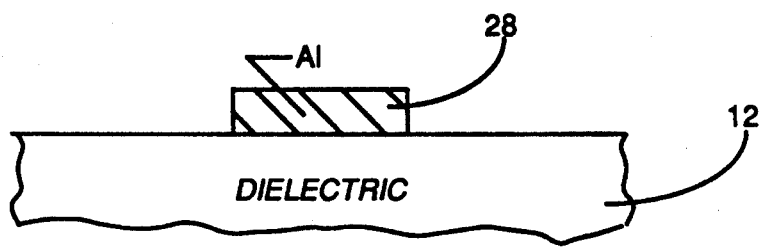
FIG. 6 is a cross-sectional view illustrating a formed aluminum layer after the etching process.

Finally in FIG. 6, a formed aluminum region 28 which originated from the aluminum layer 11 is shown disposed above the underlying dielectric layer 12.

Although a particular gas mixture is disclosed with the preferred embodiment, the $CF_4$ gas can be replaced by other carbon compounds such as $CHF_3$, etc. While the use of $CHF_3$ results in good anisotropic etching and patterning for aluminum, wafers tend to corrode badly with its use. The $Cl_2$ gas can be replaced by other halides such as $Br_2$. This gas, however, is expensive and difficult to use with standard processing techniques. Further, the described reactive ion etcher may be replaced by any commercially available reactor. The alternative reactor should be used with gases and the concentration ratios as previously described. The parameters such as pressure, power, and total flow may be varied to provide minimum etch bias without sacrificing other responses.

Thus, a novel technique to anisotropically etch aluminum and aluminum alloys has been described.

I claim:

1. A process for anisotropic etching of aluminum, comprising the steps of:

forming a plasma gas mixture having a carbon containing gas and $Cl_2$ wherein said concentration ratio of said carbon containing gas to said $Cl_2$ is at least 2:1 ; and subjecting said aluminum to said plasma gas mixture.

2. The process defined by claim 1 wherein said carbon containing gas of said plasma gas mixture is $CF_4$.

3. The process defined by claim 1 wherein said plasma gas mixture is further comprised of $BCl_3$.

4. The process defined by claim 3 wherein said plasma gas mixture has a ratio of $BCl_3$ to carbon containing gas of approximately 1:1.

5. The process defined by claim 4, further including a step of introducing helium into said plasma gas mixture.

6. A process for anisotropic etching of an aluminum layer in an etcher during a fabrication of a semiconductor device, comprising the steps of:

forming a layer of photoresist on a predetermined surface of said aluminum layer;

subjecting said aluminum layer to a gas mixture of chlorine gas and carbon containing gas wherein said gas mixture has a carbon containing gas to chlorine gas concentration ratio of at least 2:1 in said etcher;

said carbon containing gases forming a carbonaceous film along side walls developed during said etching process and preventing etching of said side walls;

said photoresist layer preventing said chlorine gas from etching said aluminum layer except where said aluminum is exposed;

applying RF power to electrodes wherein said gas mixture forms a plasma; and etching said aluminum until an underlying layer is exposed.

7. The process defined by claim 6 wherein said plasma gas mixture is further comprised of $BCl_3$ molecules.

8. The process defined by claim 7 wherein said plasma gas mixture is comprised of approximately as much $BCl_3$ as carbon containing gas.

9. The process defined by claim 8, further including a step of introducing helium into said gas mixture.

10. The process defined by claim 6, wherein said RF power is continuously adjusted so that a self-bias of typically between 200-300 volts is maintained.

11. The process defined by claim 10 wherein said aluminum layer is formed by a sputtering process.

12. The process defined by claim 6, wherein said carbon containing gas is selected from the group consisting of $CF_4$ and $CHF_3$.

13. A process for etching an aluminum film layer in a reactive ion etcher during a fabrication of a semiconductor device, comprising the steps of:

forming a layer of photoresist on a predetermined surface of said aluminum film layer;

placing said semiconductor device between electrodes in said reactive ion etcher;

subjecting said aluminum film layer to a mixture of $Cl_2$, $CF_4$ and $BCl_3$ at approximately 150-250 sccm of total flow at approximately 20-50 millitorr of pressure wherein said gas mixture has a concentration ratio of $CF_4:Cl_2$ of at least 2:1;

applying an electrical power to said gas mixture to form a plasma and adjusting said electrical power in order to maintain a self-bias of between 200-300 volts; and etching said aluminum until an underlying layer is exposed and detected using an optical emission end point detection technique.

14. The process defined by claim 13 wherein said plasma gas mixture has approximately a 1:1 ratio of $BCl_3$ and $CF_4$.

15. The process defined by claim 14 further including a step of introducing helium into said plasma gas mixture.

16. The process defined by claim 13 wherein said end point detection technique monitors the radiation intensity at 370 nanometers.

* * * * *

UNITED STATES PATENT AND TRADEMARK OFFICE
CERTIFICATE OF CORRECTION

PATENT NO. : 5,202,291
DATED : April 13, 1993
INVENTOR(S) : Peter K. Charvat, et. al.

It is certified that error appears in the above-indentified patent and that said Letters Patent is hereby corrected as shown below:

Col. 4, Line 24   Delete "ration"   Insert --ratio--
Col. 4, Line 36   After the word "ratio" Insert --.--
Col. 5, Line 23   Delete "white"    Insert --while--

Signed and Sealed this

Twenty-sixth Day of April, 1994

*Attest:*

BRUCE LEHMAN

*Attesting Officer*   *Commissioner of Patents and Trademarks*